(12) United States Patent  
Male

(10) Patent No.: US 7,042,690 B2  
(45) Date of Patent: May 9, 2006

(54) POWER-LINE, DIFFERENTIAL, ISOLATION LOSS DETECTOR

(75) Inventor: Barry Jon Male, W. Granby, CT (US)

(73) Assignee: Texas Instruments Incorporated, Dallas, TX (US)

( * ) Notice: Subject to any disclaimer, the term of this patent is extended or adjusted under 35 U.S.C. 154(b) by 314 days.

(21) Appl. No.: 10/727,455

(22) Filed: Dec. 4, 2003

(65) Prior Publication Data

US 2004/0227522 A1    Nov. 18, 2004

Related U.S. Application Data

(60) Provisional application No. 60/435,191, filed on Dec. 19, 2002.

(51) Int. Cl.  
*H02H 3/00* (2006.01)

(52) U.S. Cl. ............................. 361/62; 361/63; 361/64; 361/65; 361/66; 361/103

(58) Field of Classification Search .................... None  
See application file for complete search history.

(56) References Cited

U.S. PATENT DOCUMENTS 6,531,899 B1 * 3/2003 Male ........................ 327/100  
6,639,395 B1 * 10/2003 Male ........................ 324/106

* cited by examiner

*Primary Examiner*—Karl D. Easthom  
*Assistant Examiner*—Robert T. Dang

(74) *Attorney, Agent, or Firm*—W. Daniel Swayze, Jr.; W. James Brady; Frederick J. Telecky, Jr.

(57) ABSTRACT

In one embodiment, an integrated differential isolation loss detector is disclosed that generates a first temperature that is a function of a high side current and a second temperature that is a function of a low side current. A temperature sensor senses the difference between the first and second temperatures and provides an output signal that is indicative of the magnitude and the polarity of the sensed difference. A controller receives the output signal and if the difference is greater than a predetermined magnitude the high side current, the low side current, or both can be disconnected from the load.

In another embodiment, an integrated differential isolation loss detector is disclosed that includes a first temperature difference generator that generates first and second temperatures where the difference between the first and second temperatures is a function of the magnitude of the high side current. The integrated differential isolation loss detector further includes a second temperature difference generator coupled to the low side current that generates third and fourth temperatures where the difference between the third and fourth temperatures is a function of the magnitude of the low side current. A second temperature sensor senses the difference between the third and fourth temperatures and provides a second output signal that is indicative of the magnitude and the polarity of the sensed difference. A controller receives the first and second output signals and if the difference between the two output signals is greater than a predetermined magnitude the high side current, the low side current, or both can be disconnected from the load.

19 Claims, 5 Drawing Sheets

POWER-LINE, DIFFERENTIAL, ISOLATION LOSS DETECTOR

CROSS REFERENCE TO RELATED APPLICATIONS

This application claims priority under 35 U.S.C. §119(e) to Provisional Patent Application Ser. No. 60/435,191 filed Dec. 19, 2002; the disclosure of which is incorporated by reference herein.

STATEMENT REGARDING FEDERALLY SPONSORED RESEARCH OR DEVELOPMENT

N/A

BACKGROUND OF THE INVENTION

The present invention relates generally to a fault detector to detect ground faults in a power distribution system. More specifically, the invention relates to the detection of ground faults using one or more isolated current sensors that measure the difference in the current supplied to the load(s) and the current returning from the load(s).

One type of power delivery system is an isolated power source that provides power to one or more loads where the power source, the power delivery system, and the load are all isolated from earth ground. A fault from the power system to an earth ground can occur in the power source, the power delivery system, or the load. Under some circumstances, this fault can be difficult to detect. However, if a second fault occurs anywhere within the system a high current circuit can be created through the ground path. This high current circuit can lead to personal injury and/or fire hazards.

Power over Ethernet (POE) systems are isolated power systems in which a common 48 volt power source provides power to distributed loads over the same infrastructure wiring that carries the Ethernet data. Complete isolation from ground or other power systems is required for the system to operate. As discussed above, single isolation faults in POE isolated power systems can go undetected, with second faults potentially leading to hazardous conditions. Typically, low side isolation faults, i.e., faults in the return path from the load to the power source, are easily detected and low side detection circuits are known in the art and are often included within an integrated circuit. High side fault detection, i.e., faults in the power supply path from the power source to the load, have unique problems. High side fault detection requires circuitry that is both accurate and tolerant of voltage standoff issues when integrated using standard BiCMOS processes.

A typical solution to high side fault detection and isolation is to apply an external self-resetting PTC fuse in the high side path. Although this provides isolation protection, the aging effects on the PTC fuse due to over-current levels reduce the accuracy and long-term repeatability of the PTC fuse to sense and protect high side isolation faults. In addition, a PTC fuse does not provide any indication to the operator as to the location of the fault. In addition, the use of individual PTC fuses in a multi-channel system can excessively increase the cost of the overall system.

Therefore, it would be advantageous to provide an isolation loss detector that operates on both the high side and the low side of the power delivery system, provides indicia as to the location of the isolation loss, and further does not deteriorate over time.

BRIEF SUMMARY OF THE INVENTION

An isolation loss detector is disclosed. In one embodiment, a temperature differential generator produces first and second temperatures that are a function of the high side and low side currents respectively. A temperature difference sensor senses the first and second temperatures and provides an output voltage that is a function of the magnitude and polarity of the difference between the first and second temperatures. A control module is connected to the output voltage of the temperature difference sensor and is operative to provide indicia of the magnitude and polarity of the temperature difference. In addition, the control module can provide control signals to a high side switch, a low side switch or both in order to disconnect the high side current from the load, the low side current from the load, or both.

In another embodiment, high side and low side temperature difference generators are placed in series with the high side and low side currents respectively. The high side temperature difference generator produces first and second temperatures, where the difference between the first and second temperatures is a function of the magnitude of the high side current. Similarly, the low side temperature difference generator produces third and fourth temperatures, where the difference between the third and fourth temperatures is a function of the magnitude of the low side current. A first temperature difference sensor is thermally coupled to the first temperature difference generator and senses the first and second temperatures and provides a first output signal that is a function of the sensed temperature difference between the first and second temperatures. Similarly, a second temperature difference sensor is thermally coupled to the second temperature difference generator and senses the third and fourth temperatures and provides a second output signal that is a function of the sensed temperature difference between the third and fourth temperatures. If the high side and the low side currents are equal, the first and second output signals are substantially equal to one another. A control module receives the first and second output signals and compares the two output signals and determines the magnitude and polarity of any difference between the high side and low side currents. If this difference is greater than a predetermined value, the control module provides output indicia of the polarity and magnitude of the difference. In addition, the control module can provide control signals to a high side switch, a low side switch or both in order to disconnect the high side current from the load, the low side current from the load, or both.

Other aspects, features, and advantages of the present invention are disclosed in the detailed description that follows.

BRIEF DESCRIPTION OF THE SEVERAL VIEWS OF THE DRAWING

The invention will be understood from the following detailed description in conjunction with the drawings, of which.

DETAILED DESCRIPTION OF THE INVENTION

Figure 1:
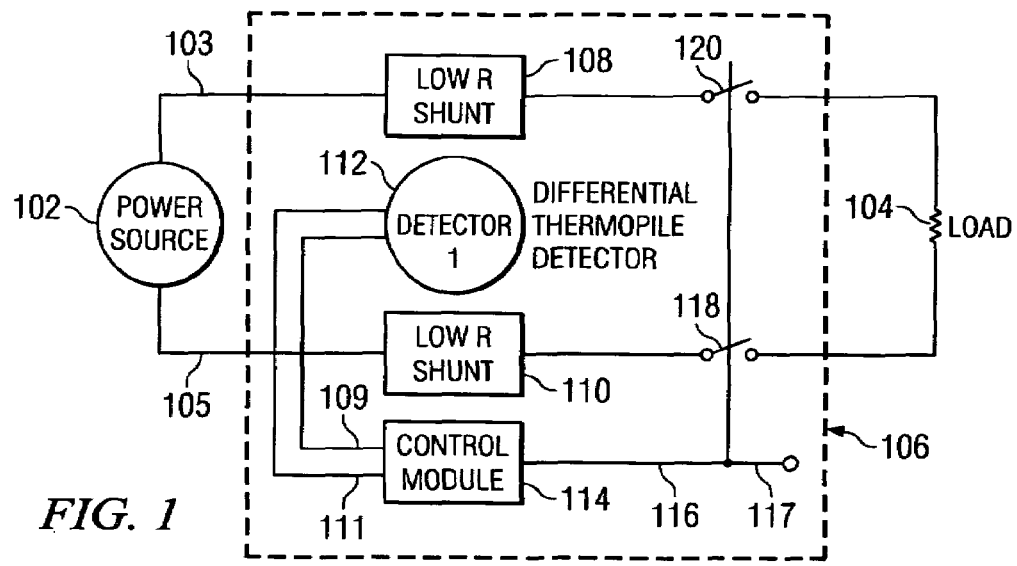
FIG. 1 is a block diagram of one embodiment of a power line fault isolation detector.

The power line isolation-loss detector described herein is able to detect an isolation loss in a power delivery system. In particular, the power line isolation-loss detector determines the difference between the current flowing to a load from a power source, i.e., the high side current, and the current returning to the power source from the load, i.e., the low side current. Under normal operating conditions, the two currents are equal and the difference between the two currents is zero. If a difference between the two currents is found, the magnitude of the isolation loss and the polarity of the isolation loss can be determined directly from the difference between the two currents.

The embodiments of the power line isolation-loss detector described herein do not directly measure the high side and low side currents. Rather, a high side thermal generator is inserted in series with the high side current and a low side thermal generator is inserted in series with the low side current. The high side and low side thermal generators produce high side and low side sets of temperatures respectively that are indicative of the respective high side current and low side currents. In one embodiment described in more detail below, the high side and the low side sets of temperatures each include a single temperature, i.e., a high side temperature and a low side temperature, wherein the high side temperature is a function of the high side current and the low side temperature is a function of the low side current. A temperature difference sensor that includes a high side temperature sensor that is thermally coupled to the high side thermal generator and a low side temperature sensor that is thermally coupled to the low side thermal generator. The temperature difference sensor provides a temperature difference output signal that is indicative of the difference between the high side temperature and the low side temperature. This temperature difference signal is therefore indicative of the difference between the high side and low side currents.

In another embodiment described in more detail below, a high side thermal difference generator is inserted in series with the high side current and a low side thermal difference generator is inserted in series with the low side current. The high side and low side thermal difference generators produce high side and low side sets of temperatures respectively that are indicative of the respective high side current and low side currents. The high side and the low side sets of temperatures each include a pair of temperatures, i.e., first and second high side temperatures difference and first and second low side temperatures, wherein the difference between the first and second high side temperatures is a function of the high side current and the difference between the first and second low side temperatures is a function of the low side current. A high side temperature difference sensor is thermally coupled to the high side thermal difference generator and provides a high side output signal that is indicative of the sensed high side temperature difference. Similarly, a low side temperature difference sensor is thermally coupled to the low side thermal difference generator and provides a low side output signal that is indicative of the sensed low side temperature difference. The difference between the high side output signal and the low side output signal is indicative of the difference between the high side and low temperature differences, and hence is indicative of the difference between the high side and low side currents.

FIG. 1 depicts a block diagram of one embodiment of a differential loss isolation detector for use in an isolated power supply. A power source 102 provides current to a load 104 via a high side connection 103 and a low side connection 105. As used herein, the high side connection 103 carries the power to the load 104 from the power source 102 and the low side connection 105 provides the return current path from the load 104 to the power source 102. In general in the embodiments described herein, the low side connection 105 is not connected to an earth ground. Under normal operating parameters, i.e., no isolation loss, the high side and low side currents are equal.

A differential loss isolation detector 106 is placed in series between the power source 102 and the load 104 in the high side current path 103 and the low side current path 105 respectively. The differential loss isolation detector 106 includes first and second low-resistance ("Low-R") shunts 108 and 110. The first and second Low-R shunts 108 and 110 are placed in series between the power source 102 and the load 104 in the high side connection and low side connection respectively. As will be explained in more detail below, the first and second Low-R shunts 108 and 110 produce first and second temperatures in response to the high side current flowing in the high side connection and the low side current flowing in the low side connection respectively. In general, when the high side and low side currents are equal, the first and second temperatures produced by the low-R shunts 108 and 110 are also equal. A detector 112 senses the first and second temperatures and provides an output signal via lines 109, 111 that is indicative of the difference, if any, between the first and second temperatures. A control module 114 receives the output signal and provides a control signal on line 116 that controls the high side cutoff switch 120 and the low side cutoff switch 118. In addition, the control signal may be output on line 117 to provide indicia of the magnitude of the difference between the two currents. The control signal can further include indicia of the polarity of the imbalance between the high side and low side currents.

The architecture depicted in FIG. 1 depicts only a single load 104 connected to the power source 102. In other embodiments there can be a plurality of loads connected in parallel with an individual high side current and low side current for each load connected to the power source 102. Each parallel connection has a pair of individual Low-R shunts connected in series between the power source 102 and the respective load with an associated detector. There may be a single controller for all of the detectors, or multiple controllers, which may be associated with one or more detectors may be used.

Alternatively, each load may be connected to the power source by a respective individual high side connection and a common low side connection as the return path for each load to the power source. In this case, the control module will combine the various temperature indications from the high side currents and compare the combination to the low side current in the common low side connection to determine if an isolation loss has occurred.

Figure 1A:
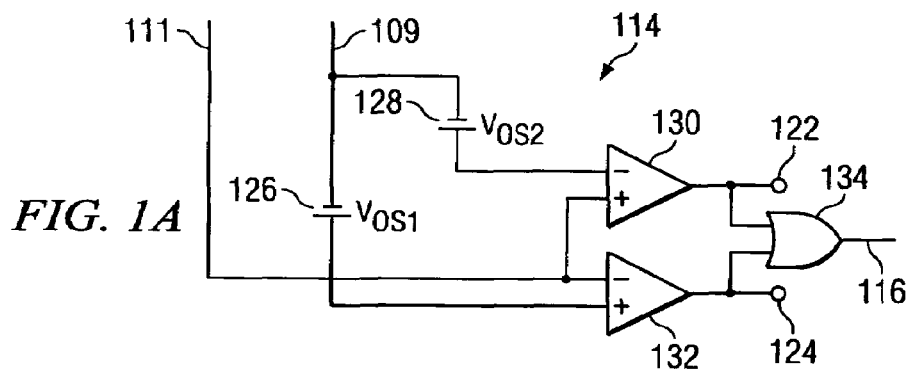
FIG. 1A is a schematic diagram of an embodiment of the control module 114 depicted in FIG. 1.

FIG. 1A provides an embodiment of the control module 114. In particular, the controller includes a first offset voltage, Vos1, 126 and a second offset voltage, Vos2, 128, each connected in series with the output line 109, to the negative input of the first comparator 130 and the positive input of the second comparator 132 respectively. The output line 111 is coupled to the positive input of the first comparator 130 and the negative input of the second comparator 132. The output of the first and second comparators 130 and 132, 122 and 124 respectively, are coupled to OR gate 134. The Output control signal 116 is provided by the OR gate. The outputs 122 and 124 of the first and second comparators 130 and 132 respectively can be used to indicate the polarity of the current difference, where output 122 indicates a high side isolation loss and output 124 indicates a low side isolation loss.

Figure 2:
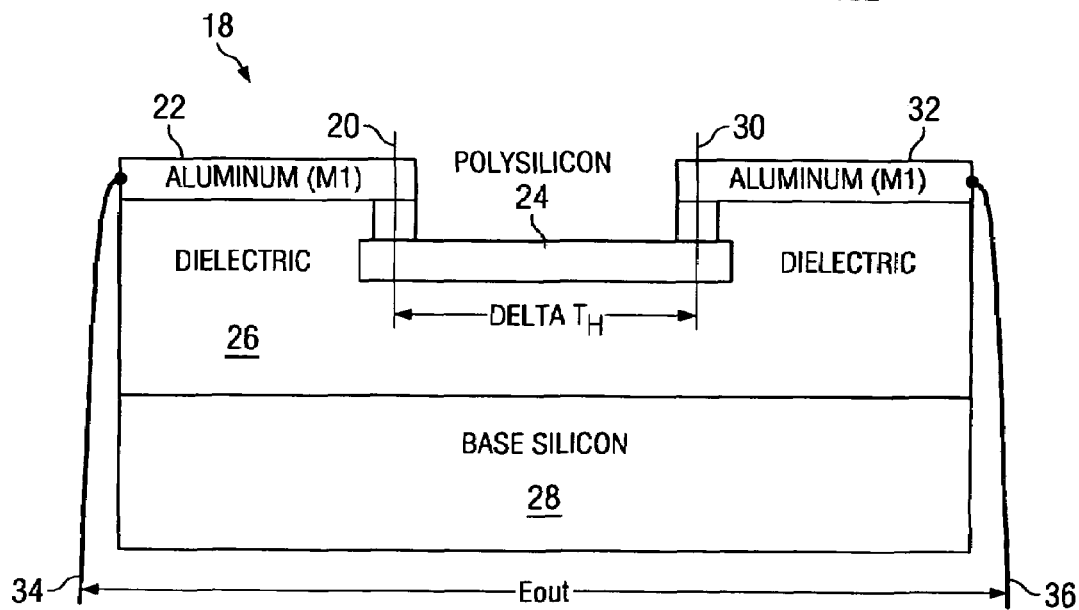
FIG. 2 is a cross section of a thermo-electric sensor formed on a silicon base suitable for use with the power line fault isolation detector depicted in FIG. 1.

The detector 112 in FIG. 1 can be a temperature transducer that operates as a Seebeck effect device that provides a voltage output that is a function of the sensed temperature difference. The detector 112 may be implemented in an integrated semiconductor device utilizing the structure illustrated in cross section in FIG. 2. In the figures herein, a silicon die is illustrated and discussed although the techniques taught are applicable to semiconductor devices in general. In FIG. 2, a dielectric layer 26 separates a base silicon layer 28 from first and second Seebeck junctions 20 and 30. The first Seebeck junction 20 is formed of a first conductor 22 in contact with a second conductor 24, which is dissimilar to the first conductor, at the first junction 20. The second Seebeck junction 30 formed between a third conductor 32, which is dissimilar to the second conductor 24, in contact with the second conductor 24 at a second junction 30. The second junction 30 is spaced apart from the first junction 20 and if the junctions 20 and 30 are held at different temperatures, a voltage $E_{out}$ is developed across the ends 34, 36 of the first and third conductors 22, 32. The pair of junctions 20, 30 are referred to as a Seebeck pair. The temperature transducer 18 generates an output voltage without requiring bias voltages and the voltage output of this transducer 18 is directly proportional to the temperature difference between the junctions 20, 30 and does not have any DC offset. In the embodiment depicted in FIG. 1, the first Seebeck junction 20 is disposed adjacent to the first Low-R shunt 108 in the high side circuit and the second Seebeck junction 30 is disposed adjacent to the second Low-R shunt 110 in the low side circuit.

The materials selected to be the dissimilar conductors determine the proportionality value between the sensed temperature difference and the output voltage, $E_{out}$. In an embodiment where the first and third conductors 22, 32 are implemented with aluminum and the second conductor 24 is implemented with polysilicon, the thermal-EMF (electromotive force) of the polysilicon-aluminum transducer 18 is about 0.7 mV/C. The embodiment utilizing aluminum and polysilicon is advantageous because the sensor can be integrated above field oxide, without any silicon diode junctions. This is particularly important as silicon diode junctions represent either an isolation voltage standoff limitation or a conductive path when the junctions become forward biased.

Figure 3:
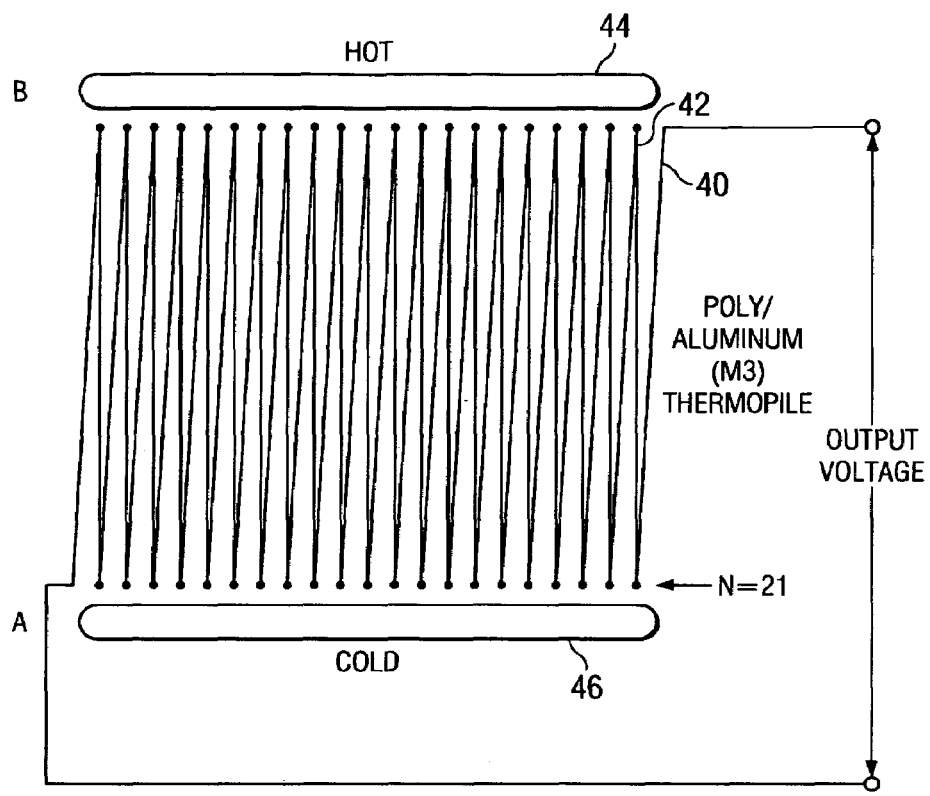
FIG. 3 is a symbolic top view of a thermo-electric device formed on a silicon base suitable for use with the power line fault isolation detector depicted in FIG. 1.

The gain of the temperature transducer 18 of FIG. 2 can be increased by connecting a number of Seebeck pairs, experiencing the same temperatures, in series. FIG. 3 illustrates a symbolic top view of a thermopile—a layout of a series of connections that increases the gain by a factor N, where N is the number of Seebeck junction pairs in series that experience the same temperature difference. In FIG. 3, vertical lines 42 represent first conductors and angled lines 40 represent second conductors. Structure 44 (B) maintains a temperature $T_{44}$ that is "hot" relative to the temperature $T_{46}$ maintained by structure 46 (A). There are (N=21) pairs of junctions in series in FIG. 3 so, for the aluminum/polysilicon embodiment discussed above, the output voltage is $[(21*0.7 mv)/C]*(T_{44}-T_{46})$. In the embodiments described herein, "hot" and "cold" when used as labels for a pair of structures only indicate polarity and not necessarily the actual relative temperature between the two structures during operation.

Figure 4:
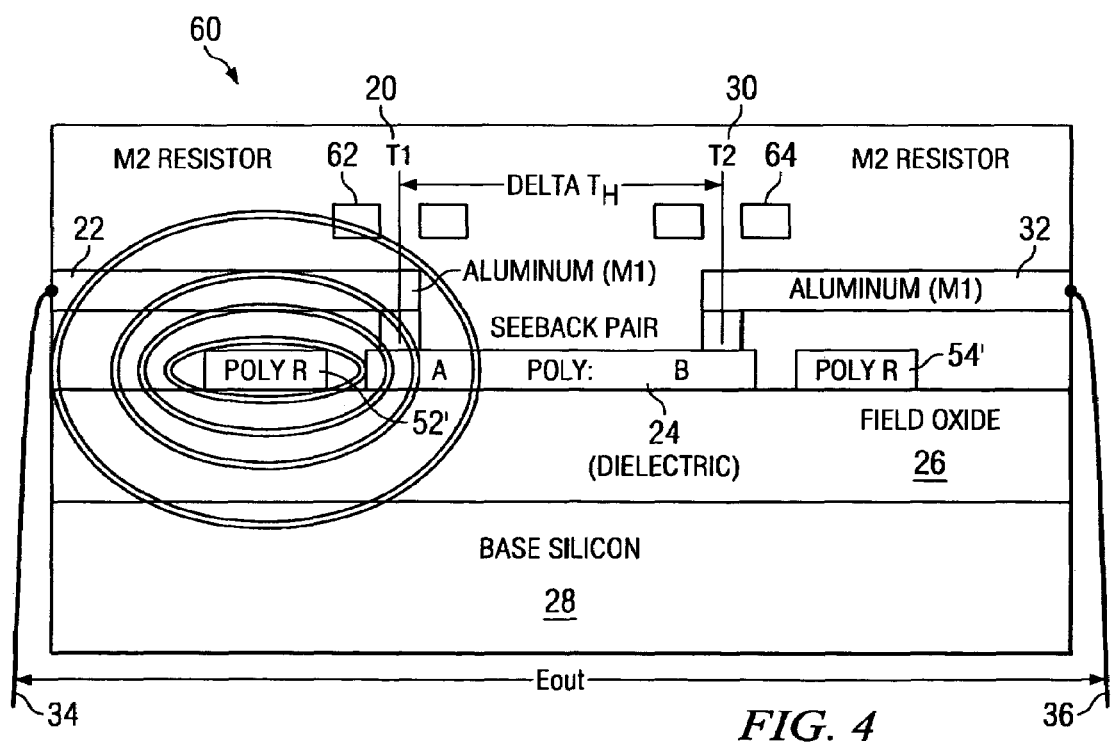
FIG. 4 is a cross section of an embodiment of an isolated differential thermo-electric device suitable for use with the power line fault isolation detector depicted in FIG. 1.

A structure that includes both the detector 112 and shunts 108 and 110 of FIG. 1 is shown in cross section in FIG. 4. In FIG. 4, the basic structure of FIG. 2 is augmented by end resistors 52', 54' positioned near the Seebeck junctions A and B, where the current through the resistors 52' and 54' is understood to flow orthogonal to the page. The resistors 52' and 54' are positioned in close proximity to the Seebeck junctions A and B, but isolated from the junctions by a dielectric material. The resistors 52' and 541 in one embodiment are implemented as semiconductor structures such as polysilicon resistors 52' and 54' embedded in the dielectric layer 28 near the junctions A and B. Alternatively, the end resistors are implemented as metal resistors 62 and 64 in an inter-metal dielectric layer above the highest layer of the temperature transducer 18. A temperature gradient between junctions A and B is created by energizing one resistor in close proximity to one junction. Alternatively, a temperature gradient between junctions A and B is established by energizing both resistors, but with different currents. Polysilicon and Metal 2 resistors are shown in the embodiment illustrated as these materials keep the resistors above the field oxide layer, although similar materials may be substituted to suit alternate semiconductor processes as is known in the industry. Current in the left resistor 52'or 62 of FIG. 4 creates a positive component in the output voltage across the terminals 34, 36 of the comparator 60. Current in the right side resistor 54' or 64 creates a negative component in the output voltage. The net effect is a current comparator or current controlled voltage source. This current comparator is a power measurement device since small temperature differences caused by low-level signals do not result in generating significant output voltages. When the resistors and associated sensing junctions are spaced further apart, the reduced thermal leakage path allows larger temperature differences to be maintained between the measurement points.

Figure 5:
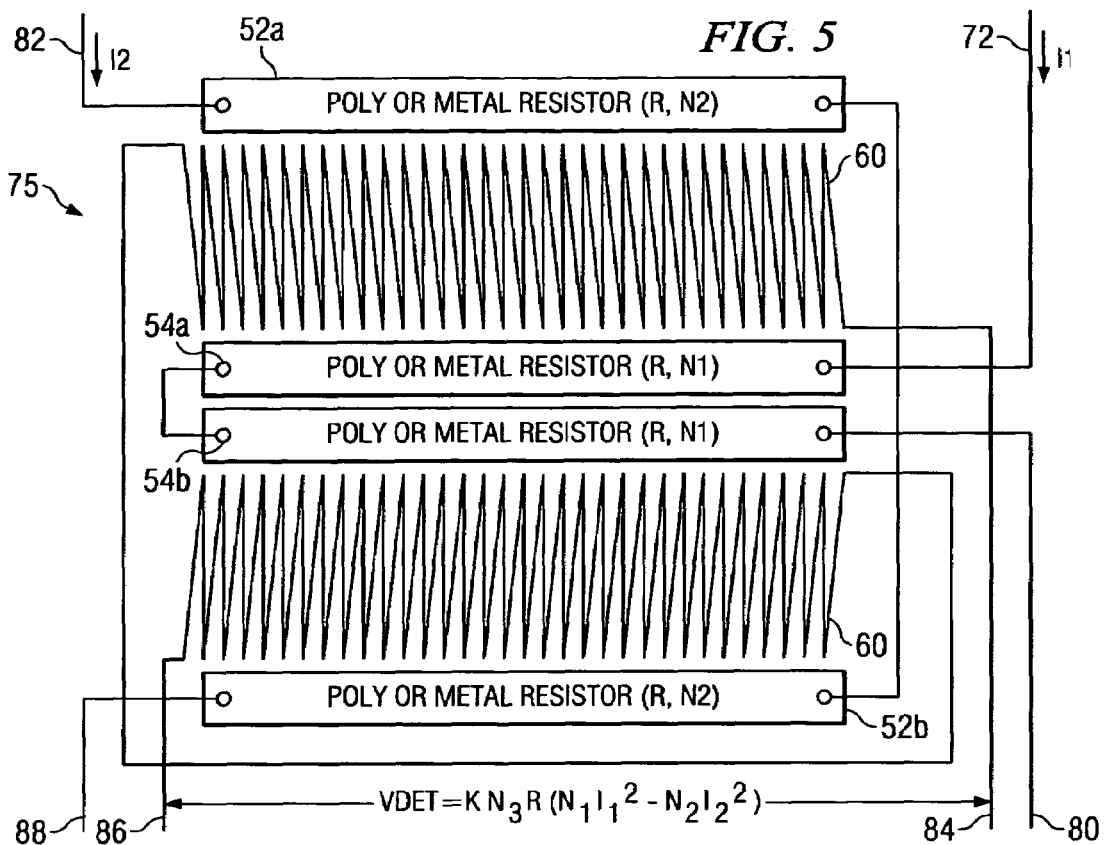
FIG. 5 is a symbolic top view of a layout of multiple thermo-electric devices, such as those of FIG. 5, arrayed to reduce thermal interference and suitable for use with the power line fault isolation detector depicted in FIG. 1.

The structure of FIG. 4 forms a fundamental comparator cell 60 whose gain is increased by connecting multiple cells in series as previously discussed. FIG. 5 illustrates a symbolic top view of a layout that connects multiple cells while reducing or substantially eliminating the sensitivity of a resultant comparator 75 to external temperature gradients. The orientation of the resistors 52a/52b and 54a/54b creates a set of cold and hot areas ABBA (FIG. 5) that cancel out the effects of external die temperature gradients while measuring the actual temperature difference between the resistors. Input current $I_1$ passes from input 72 to output 80 heating resistor 54a/54b whose resistance is determined by the resisitivity per unit length R times the length $L_1$. Similarly, input current $I_2$ passes from input 82 to output 88 heating resistor 52a/52b whose resistance is determined by the resisitivity per unit length R times the length $L_2$. Serially connected comparator cells 60 develop a voltage $V_{det}$ across the terminals 84, 86 expressed as:

$$V_{DET}=kNR(L_1 I_1^2 - L_2 I_2^2)$$

where k is the thermal-EMF of the materials selected for the conductors and N is the number of comparator cells 60 in the comparator 75.

Figure 6:
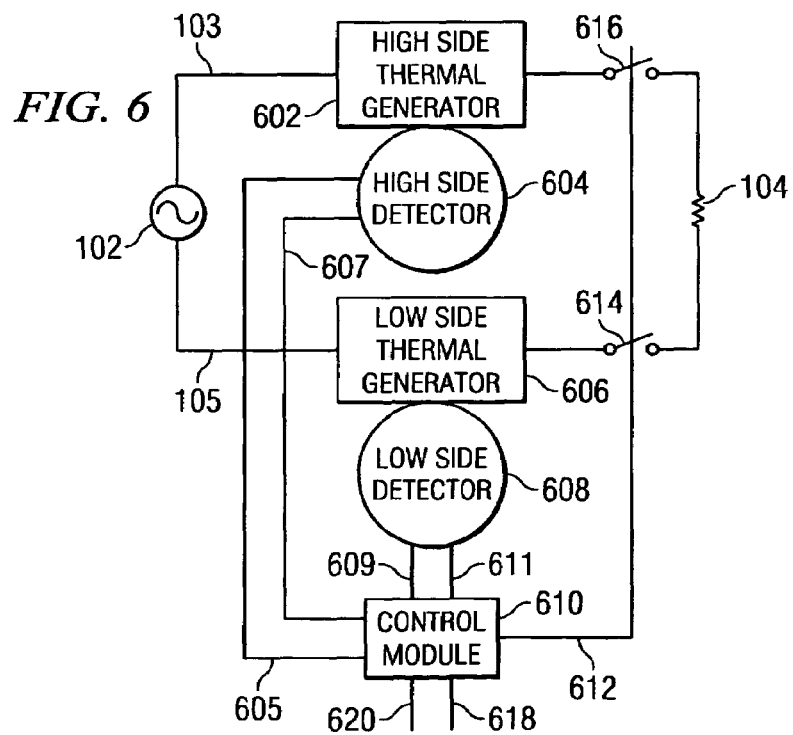
FIG. 6 is a block diagram of another embodiment of a power line fault isolation detector.

FIG. 6 depicts another embodiment of a differential loss isolation detector. A power source 102 provides current to a load 104 via a high side connection 103 and a low side connection 105. As discussed above, under normal operating parameters, i.e., no isolation loss, the high side and low side currents are substantially equal. A high side thermal generator 602 is connected in series between the power source and the load on the high side and a low side thermal generator 606 is connected in series between the power source 102 and the load 104 on the low side. As will be explained in more detail below, the high side thermal generator 602 and the low side thermal generator 606 produce high side and low side differential temperatures that are a function of the high side current and the low side current respectively. The high side thermal difference generator 602 is thermally coupled to a high side thermal difference sensor 604. The high side thermal difference sensor 604 senses the differential temperature generated by the high side thermal difference generator 602 and provides an output voltage that is a function of the sensed temperature difference. Similarly, the low side thermal difference generator 606 is thermally coupled to a low side thermal difference sensor 608. The low side thermal difference sensor 608 senses the differential temperature generated by the low side thermal difference generator 606 and provides an output voltage that is a function of the sensed temperature difference. Both the high side and low side temperature difference sensors 604 and 608 provide output signals via lines 605, 607 and 609, 611 respectively to a control module 610. If the high side and low side currents are equal, the temperature differences produced by the high side temperature difference generator 602 and the low side temperature difference generator 606 are equal. Accordingly, the output signals from the high side and low side thermal difference sensors 604 and 608 will also be equal. However, small differences in the processing and/or the materials used may result in small temperature offsets between the two differential temperatures generated by the respective current sensors. The control module 610 receives both output signals and determines if the two output signals are equal or unequal. In the event that the currents are unequal and hence an isolation fault exists, a control signal can be used to disconnect the high side current from the load, the low side current from the return path to the power source, or both. In addition, control signals 618 and 620 can be used to provide indicia of the polarity of the current difference to aid in determining the location of the isolation fault.

The architecture depicted in FIG. 6 depicts only a single load 104 connected to the power source 102. In other embodiments there can be a plurality of loads connected in parallel with an individual high side current and low side current for each load connected to the power source 102. Each parallel connection can have a pair of thermal difference generators connected in series between the power source 102 and the respective load, each thermal difference generator having associated therewith a corresponding detector. There may be a single controller for all of the detectors or multiple controllers each of which is associated with one or more detectors may be used.

Alternatively, each load may be connected to the power source by a respective individual high side connection and a common low side connection as the return path for each load to the power source. In this case, the control module will combine the various temperature indications from the high side currents and compare the combination to the low side current in the common low side connection to determine if an isolation loss has occurred.

Figure 7:
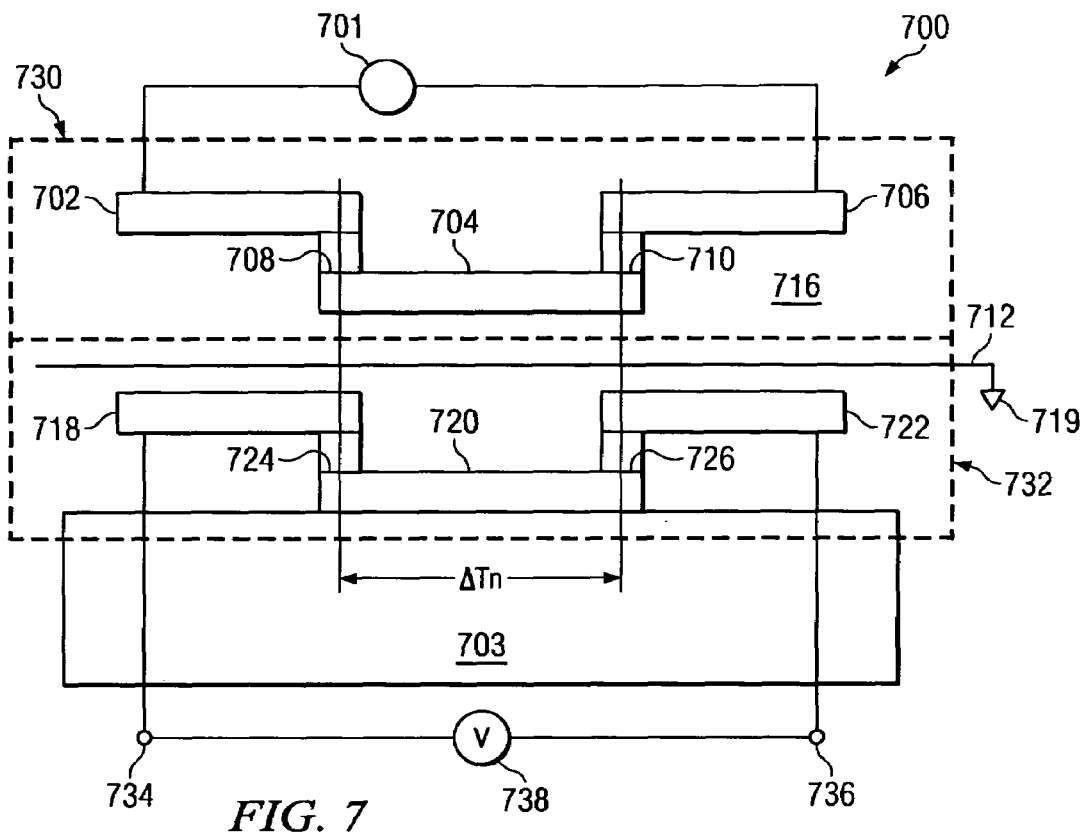
FIG. 7 is a cross sectional view of an embodiment of another current sensor suitable for use with the power line fault isolation detector depicted in FIG. 6.

FIG. 7 depicts an embodiment of the thermal difference generator/thermal difference sensor pair depicted in FIG. 6. In particular, FIG. 7 depicts a current sensor cell 700 disposed on a silicon die 703, which can contain other integrated electronic circuit devices. The current sensor 700 includes a thermal difference generator 730 that utilizes a pair of dissimilar conductors configured and arranged as a thermoelectric Peltier device. A thermoelectric Peltier device includes two dissimilar conductors, or semiconductors, that are joined at two junctions that are physically spaced apart from one another and electrically connected by one of the two dissimilar conductors. A current flowing through the Peltier device results in a temperature difference between the two junctions. The first junction that receives the input current loses thermal energy as the electrical current flows to the second junction, thus cooling the first junction to a first temperature. The second junction receives the electrical current from the first junction and is heated to a second temperature. The electrical current exits the Peltier device and is returned to the current source or circuit. The only resistance present in the device is the series resistance in the conductor that is used to electrically connect the first and second junction. Thus, a Peltier device will generate a temperature difference between a first and second junction that is a function of the input current.

A thermal difference sensor 732 utilizes a pair of dissimilar conductors configured and arranged as a thermoelectric Seebeck transducer. A Seebeck transducer includes two dissimilar conductors, or semiconductors, that are joined together at a pair of junctions that are physically spaced apart from one another and electrically connected by one of the two dissimilar conductors. When one of the junctions is at first temperature and the second junction is at a second temperature, a thermal EMF (voltage) is generated, wherein the thermal EMF is a function of the temperature difference of the two junctions. In the current sensor cell 700 depicted in FIG. 7, a first temperature sensing junction of the Seebeck transducer is thermally coupled to the first temperature generating junction of the Peltier device and is cooled thereby. Similarly, a second temperature sensing junction of the Seebeck transducer is thermally coupled to the second temperature generating junction of the Peltier device and is heated thereby.

In particular as depicted in FIG. 7, the thermal difference generator, the Peltier device, 730 includes a current input portion 702 that consists of a first conductive material. The current input portion 702 is electrically coupled to sample current from power source 701. The current input portion 702 is physically coupled to a current transfer portion 704 at a first temperature generating junction 708, wherein the current transfer portion 704 consists of a second conductive material that is dissimilar to the first conductor. The current transfer portion 704 is physically coupled to a current output portion 706 at a second temperature generating junction 710 that is physically spaced apart from the first temperature generating junction 708. The current output portion 706 consists of the first conductive material and is electrically coupled to the sampled current source 701 and provides the sampled current return path thereto. As discussed above with respect to the Peltier generator, the current 701 flowing through the input portion 702, across the junction 708, through the current transfer portion 704, across the junction 710, and through the output portion 706 cools the first junction 708 and heats the second junction 710. Accordingly, the first junction 708 is cooled to a first temperature, T1, and the second junction 710 is heated to a second temperature, $T_2$.

As further depicted in FIG. 7, the thermal difference sensor, i.e., the Seebeck transducer operates as discussed above with respect to FIG. 2. In the embodiment depicted in FIG. 7, the Seebeck transducer 732 includes a first output portion 718 that consists of a third conductive material. The first output portion 718 is physically coupled to a current transfer portion 720 at a first temperature sensing junction 724, wherein the current transfer portion 720 consists of a fourth conductive material that is dissimilar to the third conductor. The current transfer portion 720 is physically coupled to a second output portion 722 at a second temperature sensing junction 726 that is physically spaced apart from the first temperature sensing junction 724. The second output portion 722 consists of the third conductive material. The first temperature sensing junction 724 is placed physically proximate to the first temperature generating junction 708 so as to be thermally coupled to the first temperature generating junction 708. The second temperature sensing junction 726 is placed physically proximate to the second temperature generating junction 710 so as to be thermally coupled to the second temperature generating junction 710. The output sensor voltage 728 is taken across the first and second output portion 718 and 722 respectively at terminals 734 and 736 where it is available for measurement or other processing.

A dielectric material 716 is disposed between the thermal difference generator 730 and the thermal difference sensor 732. The dielectric material 716 reduces the thermal transfer between first temperature generating junction 708 and the first temperature sensing junction 724 and between the second temperature generating junction 710 and the second temperature sensing junction 726. Accordingly, the thermal coupling of the first temperature generating junction 708, which is cooled to temperature T1, to the first temperature sensing junction 724 results in the cooling of the first temperature sensing junction 724 to a temperature T1'. Typically, the temperature T1' is not equal to the temperature T1, and in general the temperature T1' is higher than the temperature T1. Similarly, the thermal coupling of the second temperature generating junction 710, which is heated to temperature T2, to the second temperature sensing junction 726 results in the heating of the second temperature sensing junction to a temperature T2'. Typically, the temperature T2' is not equal to the temperature T2, and in general the temperature T2' is lower than the temperature T2.

In the embodiment depicted in FIG. 7 the current sensor 700 is constructed as an integral component on a silicon integrated circuit 703. Some semiconductor manufacturing processes use copper as an extremely low resistance high current interconnect. Typically this copper interconnect is placed on top of a polymide-insulating layer that offers high breakdown voltages. Aluminum traces are also used at various levels in the process to act as electrical interconnects at those levels. Vias formed by the manufacturing process are used to interconnect traces of different levels. Thus, the first and second temperature generating junctions 708 and 710 of the thermal difference generator are formed by first and second vias respectively, that join the input portion 702 and the output portion 706 to the current transfer portion 704. In the embodiment depicted in FIG. 7, conductors 702 and 706 are copper and 704 is an aluminum layer-3 metal.

When the thermal difference sensor, i.e., the Seebeck transducer 732, can be constructed as an integral component on an integrated circuit, the first and second temperature sensing junctions 724 and 726 respectively can be constructed from among several choices of dissimilar materials. Two of the design considerations that are important to the selection of the materials are the proximity to the first and second temperature generating junctions 708 and 710 respectively, and the presence of parasitic elements. The first and second temperature sensing junctions may be formed at the intersection of a polysilicon conductor trace, an aluminum conductor trace and a contact. The contact provides the ohmic connection from a layer-3 metal to the polysilicon.

In the embodiment depicted in FIG. 7 an optional Faraday shield layer 712 is shown disposed between the thermal difference generator and the thermal difference sensor and being grounded to ground 719. The Faraday shield 712 is preferentially constructed of an aluminum metal 2 layer.

Figure 8:
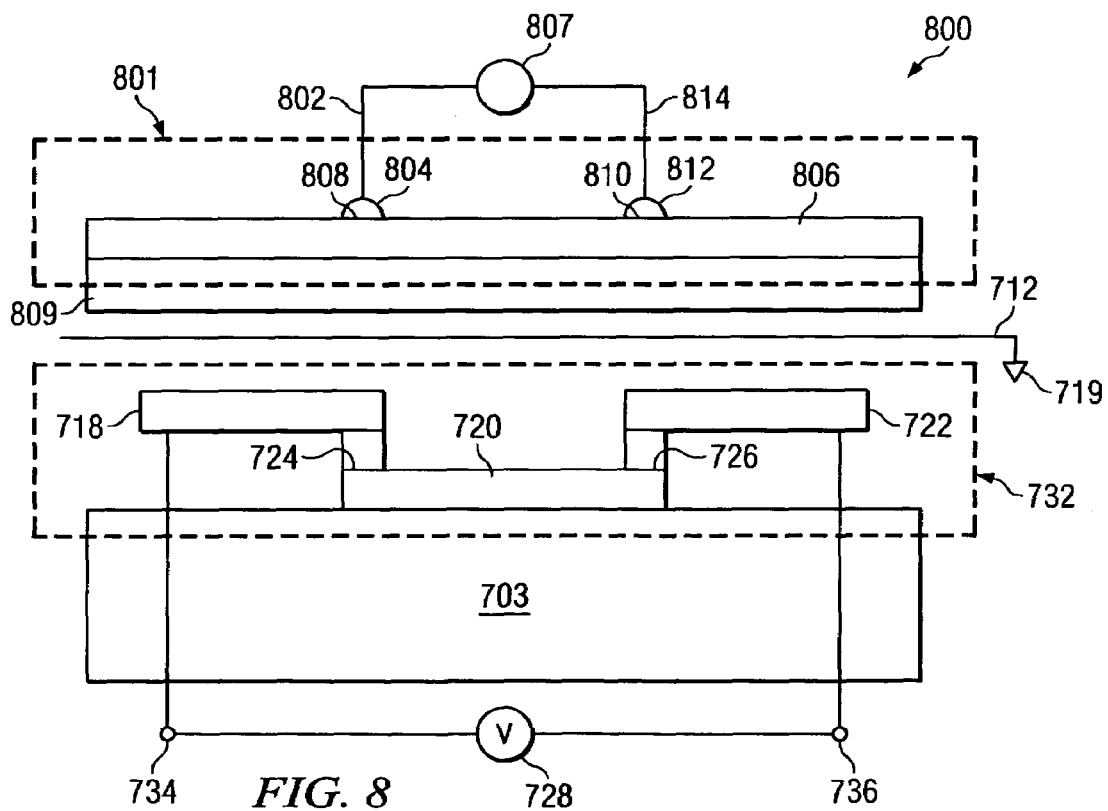
FIG. 8 is a cross sectional view of another embodiment of a current sensor suitable for use with the power line fault isolation detector depicted in FIG. 6.

FIG. 8 depicts another embodiment of a temperature generator/detector current sensor cell 800 that is disposed on a silicon die and is suitable for use as the differential loss detector depicted in FIG. 6. The current sensor cell 800 employs a Peltier device as a temperature difference generator 801, and a Seebeck transducer as a temperature difference sensor 732 that is thermally coupled to the temperature difference generator 801. The current sensor cell 800 operates in a similar manner to the embodiment depicted in FIG. 7. However, the Peltier device 801 is structurally different from the embodiment depicted in FIG. 7 while the structure of the Seebeck transducer 732 is substantially the same.

In particular as depicted in FIG. 8, the Peltier device 801 includes a first bondwire 802 bonded by a first conductive pad 804 to a current transfer portion 806 forming a first temperature generating junction 808. A second bondwire 814 is bonded by a second conductive pad 812 to the current transfer portion 806 forming a second temperature generating junction 810. In the embodiment depicted in FIG. 8, the first and second bond wires 802 and 814 and the first and second conductive pads 804 and 812 consist of a first conductive material, and the current transfer portion 806 consists of a second conductive material that is dissimilar to the first conductive material. In one embodiment, the first conductive material is aluminum or gold and the second conductive material is copper. The second conductive pad 810 is spaced apart from the first conductive pad 808, and is electrically coupled to the first pad 808 via the current transfer portion 806. The first bondwire 802 receives sampled current from power source 807 as an input current to the current sensor cell. A return path for the sampled current is provided by the second bondwire 814 that is coupled to the power source 807. As discussed above with reference to FIG. 7, and the Peltier generator described therein, the current 807 flowing through the first bondwire 802, across the first temperature generating junction 808, through the current transfer portion 806, across the second temperature generating junction 810, and through the second bondwire 814, cools the first temperature generating junction 808 and heats the second temperature generating junction 810. Accordingly, the first junction 808 is cooled to a first temperature, $T_1$, and the second junction 810 is heated to a second temperature, $T_2$.

The thermal difference sensor, i.e., the Seebeck transducer, 732 depicted in FIG. 8 operates as described above with respect to FIG. 7.

In general, in the embodiments described above, the relationship between the magnitude of the measured current and the generated temperature difference is linear. For a given range of current, the overall gain of the temperature difference generator system is low. The generated temperature difference is dependent upon the conductor geometries used in the layout on the silicon die, and upon the types of conductors used. The current transfer portion 704 in FIGS. 7 and 806 in FIG. 8 are both conductive materials and therefore shunt the generated thermal energy away from the first and second temperature generating junctions. In addition, the illustrated embodiment depicts the current transfer portion 704 in FIG. 7 and the current transfer portion 806 in FIG. 8 as a straight linear thermal path between the first and second junctions 708, 710 in FIG. 7 and 808, 810 in FIG. 8. However, the respective conductor path may be curved, thereby lengthening the thermal path and reducing the thermal shunting effects of the conductors.

Furthermore, as discussed above with respect to both the described embodiments, the temperature difference that is sensed by the Seebeck transducer is less than the actual temperature difference generated by the Peltier device due to losses that are inherent in the system. As depicted in FIG. 7 and FIG. 8 the dielectric material 716 and 809 respectively that is disposed between the Peltier device and the Seebeck transducer reduces the thermal transfer therebetween. In the embodiment depicted in FIG. 7 silicon dioxide can be the dielectric material that is used. In the embodiment depicted in FIG. 8, polymide can be used as the dielectric material, although for both the embodiments depicted in FIGS. 7 and 8 other dielectrics may be used depending on their availability in the particular semiconductor processing methodology. In another embodiment, the Peltier device and the Seebeck transducer may be mechanically suspended so that air is the dielectric disposed around the temperature difference generator and sensor. Advantageously when air is the dielectric disposed around the temperature difference generator and sensor, the thermal shunting effects of the bulk silicon and the dielectric material outside the generator and sensor are greatly reduced. This increases the gain of the temperature difference generator and sensor by increasing the thermal coupling therebetween. In addition, if a Faraday shield, 712 in FIG. 7 and FIG. 8 is inserted between the temperature difference generator and sensor, the thermal transfer will also be reduced due to the thermal conduction and shunting of the conductor used in the Faraday shield, but has the benefit of removing dynamic signal coupling between the input and output circuits.

As discussed above, the embodiments described herein have a low gain linear transfer function. The low gain of the transfer function is due to the low inherent gain of the Peltier device and the Seebeck transducer, the thermal shunting effect of the conductors used in both the devices, the reduced heat transfer due to the dielectric disposed between the temperature difference generator and sensor, and the lower heat transfer due to the use of a Faraday shield. As such, a Peltier device in which the first and second temperature generating junctions are points and a Seebeck transducer that has only a single pair of temperature sensing junctions may be of relatively limited use. Accordingly, for a current measurement system having a higher gain, given the limitations discussed above, the thermal difference generator can include first and second via structures as linear structures providing a greater joined surface between the two dissimilar materials and thereby producing larger temperatures, although the temperature difference will be the same. Furthermore to further increase the gain of the system, the thermal difference generator can include a plurality of temperature sensing junctions.

Figure 9:
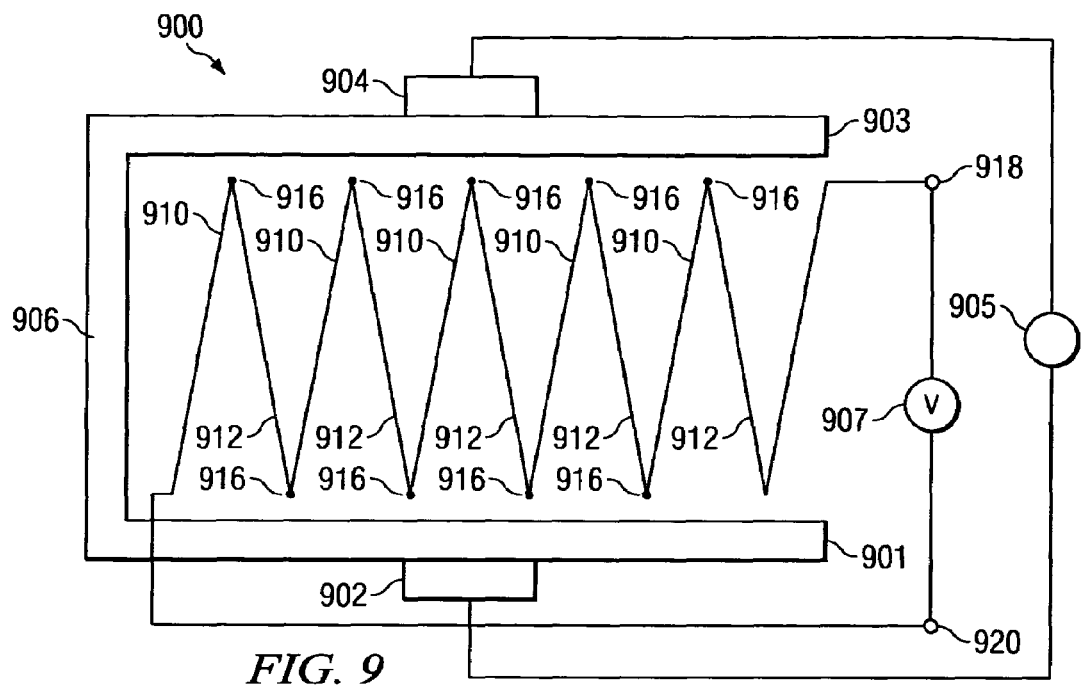
FIG. 9 is top view of the embodiment of the current sensor depicted in FIGS. 7 and 8.

FIG. 9 depicts an embodiment of a current sensor employing a plurality of temperature difference sensing cells similar to those depicted in FIGS. 7 and 8. FIG. 9 depicts a current sensor 900 for sampling a current provided by power source 905. The power source 905 is coupled to the current sensor 900 through a current input portion 902 and current output portion 904. The current input portion 902 and current output portion 904 can be either the current input portion 702 and current output portion 706 or the first and second bondwires 802 and 814 and first and second conductive pads 804 and 812 used in FIGS. 7 and 8 as described above. The current input portion 902 and a current transfer portion 906 are formed from dissimilar conductors. The current input portion 902 and the current transfer portion 906 are joined together by a first via 901 forming a temperature-generating junction, which as discussed above is the "cold" via. A current output portion 904 consisting of the same material as the current input portion 902 is joined with the current transfer portion 906 in a second via 903, forming a second temperature-generating junction. The second via 903 is electrically connected to the first via 909 via the current transfer portion 906. In the illustrated embodiment, the current input and output portions 902 and 904 respectively consist of copper interconnect and the current transfer portion 906 consists of aluminum traces. The current output portion 904 returns the sampled current to the current source 905.

A Seebeck transducer that operates as discussed above with respect to FIGS. 3 and 7 is thermally coupled to the "hot" and "cold" temperature generating junctions 901 and 903. Approximately one-half the plurality of temperature sensing junctions 916 are disposed beneath the temperature generating junction formed in via 909 and thermally coupled thereto. The other approximately one-half of the plurality of the temperature sensing junctions 916 are disposed beneath the temperature generating junction formed in via 903 and are thermally coupled thereto.

Figure 10:
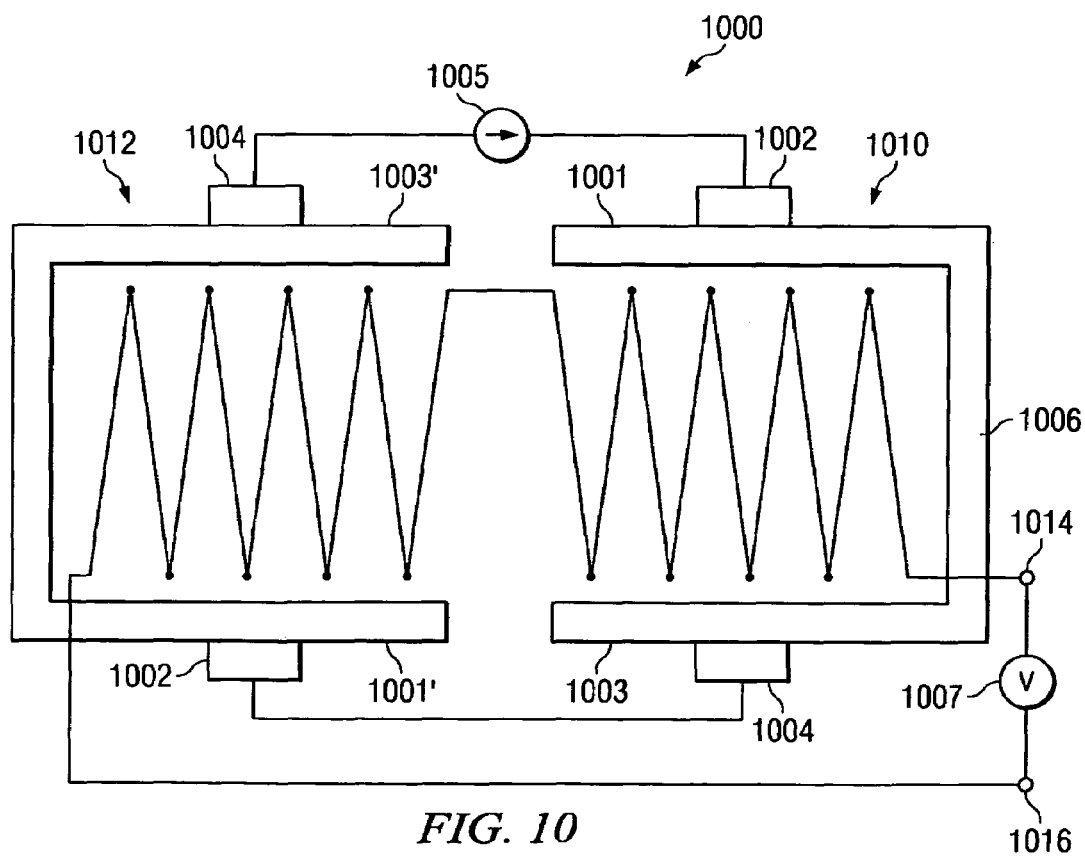
FIG. 10 is a top view of a pair of cross-coupled current sensors suitable for use with the power line fault isolation detector depicted in FIGS. 7 and 8.

As discussed with respect to FIG. 5, other components present on a silicon die will generate heat that may interfere with the temperature sensors used in the current measurement system described herein. FIG. 10 depicts an arrangement of two current sensor modules of the type depicted in FIGS. 7 and 8 that reduces or substantially eliminates the sensitivity of the current sensor to temperature gradients external to the current sensor. Each of the current sensor modules has a pair of temperature generating junctions and a plurality of temperature sensing junctions coupled to one or the other temperature generating junction.

In particular, FIG. 10 depicts a current sensor 1000 including a cross-coupled pair of current measurement cells. The current measurement cells can be either of the embodiments depicted in FIGS. 7 and 8. In particular, FIG. 10 depicts a first current measurement cell 1010 and a second current measurement cell 1012 that is adjacent to the first current measurement cell 1010 and is oriented in an opposite thermal and electrical configuration. A sampled current 1005 is applied to the first current measurement cell 1010 and enters cold via 1001, as discussed above. The sampled current flows through the first current measurement cell 1010 and exits by the hot via 1003. The sampled current is then applied to the second current measurement cell 1012 and enters cold via 1001'. The sampled current flows through the second current measurement cell 1012 and exits by the hot via 1003'. The cold via 1001 of the first measurement cell 1010 is adjacent to the hot via 1003' of the second measurement cell 1012. Similarly, the hot via 1003 of the first measurement cell 1010 is adjacent to the cold via 1001' of the second measurement cell 1012. In this configuration a temperature gradient external to the current sensor will cause equal differential voltages of opposite polarity to be generated by the first and second current measurement cells 1010 and 1012 respectively. The two differential voltages will substantially cancel out one another eliminating the interfering effect of the external temperature gradient. The output signal is available across terminals 1014 and 1016 for measurement and other processing. Although only two current measurement cells are illustrated in the embodiment depicted in FIG. 10, any even number of current measurement cells may be employed.

Although only one pair of cross-coupled current sensors are depicted, there may be any even number, n, of current sensors used as depicted. Each current sensor includes a pair of temperature generating junctions and a corresponding pair of temperature difference sensors, where each temperature difference sensor can include 2 m pair of temperature sensing junctions, where there are m temperature sensing junctions for each temperature generating junction. A constant K is used to describe the temperature difference generator and sensor characteristics and the thermal transfer therebetween. The value of K will change depending on the dielectric constant of the material disposed between the thermal difference generator and sensor and whether a Faraday shield is used. The output signal 1007 is then given by:

$$E_{out}=I*K*n*m$$

Those of ordinary skill in the art should further appreciate that variations to and modification of the above-described methods, apparatus and system for constructing a isolation loss detector may be made without departing from the inventive concepts disclosed herein. Accordingly, the invention should be viewed as limited solely by the scope spirit of the appended claims.

What is claimed is:

1. A power line isolation loss detector for determining the magnitude and polarity of a difference between a high side current and a low side current, the isolation loss detector comprising:
   a high side thermal generator coupled to the high side current and a low side thermal generator coupled to the low side current, the high side thermal generator and the low side thermal generator providing high side and low side sets of temperatures indicative of the high side and low side current respectively;
   a temperature difference sensing module thermally coupled to the high side and low side thermal generators and configured and arranged to sense the high side and low side sets of temperatures and to provide a set of temperature difference sensor output signals indicative of the magnitude and polarity of a difference between the sensed high side and low side sets of temperatures;
   a control module coupled to the temperature sensor output voltage and in the event that the magnitude of the temperature sensor output voltage exceeds a predetermined threshold, the output module being operative to selectively disconnect the high side and/or low side current based on the polarity and magnitude of the of the temperature sensor output voltage.

2. The power line isolation loss detector of claim 1 wherein the high side set of temperatures includes a single high side temperature indicative of the high side current and the low side set of temperatures includes a single low side temperature indicative of the low side current.

3. The power line isolation loss detector of claim 2 wherein the temperature difference sensor includes a high side temperature sensor thermally coupled to the high side thermal generator, the high side temperature sensor operative to sense the single high side temperature and a low side temperature sensor thermally coupled to the low side thermal generator, the low side temperature sensor operative to sense the single low side temperature and wherein the set of temperature difference sensor output signals includes a single temperature difference output signal.

4. The power line isolation loss detector of claim 3 wherein the temperature difference sensing module includes at least one Seebeck temperature sensor.

5. The power line isolation loss detector of claim 3 wherein the high side thermal generator includes a first low-resistance shunt disposed in series with the high side current and the low side thermal generator includes a second low-resistance shunt disposed in series with the low side current wherein each low-resistance shunt produces a temperature that is proportional to the square of the high side and low side current respectively.

6. The power line isolation loss detector of claim 1 wherein the high side thermal generator includes a high side thermal difference generator that provides first and second high side temperatures and the low side thermal generator includes a low side thermal difference generator that provides first and second low side temperatures.

7. The power line isolation loss detector of claim 6 wherein the high side set of temperatures includes the first and second high side temperatures and the low side set of temperatures includes the first and second low side temperatures.

8. The power line isolation loss detector of claim 7 wherein the temperature difference sensing module includes a high side temperature difference sensor thermally operative to sense the first and second high side temperatures and a low side temperature difference sensor operative to sense the first and second low side temperatures and wherein the set of temperature difference sensor output signals includes the difference between the sensed firs and second high side temperatures and the difference between the first and second low side temperatures.

9. The power line isolation loss detector of claim 6 wherein the high side thermal generator includes a high side Peltier thermal difference generator and the low side thermal generator includes a low side Peltier thermal difference generator.

10. The power line isolation loss detector of claim 6 wherein the temperature difference sensing module includes at least two Seebeck temperature sensors.

11. A power line isolation loss detector for determining the magnitude and polarity of a difference between a high side current and a low side current, the loss detector comprising:
    a high side thermal generator connected in series with the high side current producing a first temperature as a function of the high side current;

a low side thermal generator connected in series with the low side current producing a second temperature as a function of the low side current;

a temperature difference sensor thermally coupled to the first and second thermal generators, the temperature difference sensor operative to sense the first and second temperatures and to provide a temperature sensor output voltage indicative of the magnitude and polarity of a difference between the sensed first and second temperatures;

a control module coupled to the temperature sensor output voltage and in the event that the magnitude of the temperature sensor output voltage exceeds a predetermined threshold, the output module being operative to selectively disconnect the high side and/or low side current based on the polarity and magnitude of the of the temperature sensor output voltage.

12. The power line loss detector of claim 11 wherein the high side thermal generator includes a high side resistor circuit having a high side resistance, the first resistor coupled to the high side current, wherein the high side resistor circuit dissipates heat according to the first resistance multiplied by the square of the high side current;

low side thermal generator includes a low side resistor circuit having a low side resistance, the second resistor coupled to the low side current, wherein the low side resistor circuit dissipates heat according to the second resistance multiplied by the square of the low side current; and the temperature difference sensor includes a thermopile having a plurality of Seebeck temperature sensing transducers, wherein each of the Seebeck temperature sensing transducers includes a first temperature sensing junction thermally coupled to the high side thermal generator and a second temperature sensing junction thermally coupled to the low side thermal generator.

13. The power line current loss detector of claim 12 wherein the high side resistor circuit of the high side thermal generator includes first and second elongated resistors electrically connected in series;

the low side resistor circuit of the low side thermal generator includes third and fourth elongated resistors electrically connected in series;

the first, second, third, and fourth resistors physically configured and arranged parallel to one another and the third and fourth resistors interposed between the first and second resistors;

the plurality of Seebeck temperature sensing transducers including a first and second plurality of Seebeck temperature sensing transducers, wherein the first plurality of the Seebeck temperature sensing transducers includes a first temperature sensing junction thermally coupled to the first resistor and a second temperature sensing junction thermally coupled to the third resistor; and the second plurality of the Seebeck temperature sensing transducers includes a first temperature sensing junction thermally coupled to the fourth resistor and a second temperature sensing junction thermally coupled to the second resistor.

14. The power line loss detector of claim 13 wherein each of the first and second plurality of the Seebeck temperature sensing transducers includes a silicon substrate, a field oxide layer disposed on top of the silicon substrate, a gate consisting of a first conductor, and a first and second thermal difference sensing junctions formed on the gate in a spaced apart configuration, the first and second thermal difference sensing junctions formed by second and third conductors each being dissimilar to the first conductor, wherein the first and second thermal difference sensing junctions provide a voltage output that is a function of the difference in temperature between the first and second thermal difference sensing junctions.

15. The power line loss detector of claim 11 wherein the control module includes:

a first positive offset voltage source and a first negative offset voltage source;

a first comparator having a first input coupled to the temperature sensor output voltage and a second input coupled to the positive output voltage, the first comparator providing a high side warning output voltage;

a second comparator having a first input coupled to the temperature sensor output voltage and a second input coupled to the negative output voltage, the second comparator providing a low side warning output voltage; and an OR gate having a first input coupled to the high side warning output voltage and a second input coupled to the low side warning output voltage, the OR gate providing a signal an output warning signal.

16. The power line loss detector of claim 15 further including:

first and second switches coupled to the high side and low side currents respectively, the first and second switches coupled to the OR gate output and responsive to the output warning signal by opening or closing thereby allowing or preventing the high side and low side currents to flow.

17. A power line loss detector for determining the magnitude and polarity of a difference between a high side current and a low side current, the loss detector comprising:

a high side Peltier thermal difference generator electrically connected in series with the high side current, the Peltier thermal difference generator operative to generate first and second high side temperatures, the high side Peltier thermal difference generator including first and second temperature generating junctions, the temperature difference between the first and second temperature generating junctions being a function of the high side current;

a low side Peltier thermal difference generator electrically connected in series with the low side current, the Peltier thermal difference generator operative to generate first and second low side temperatures, the low side Peltier thermal difference generator including third and fourth temperature generating junctions, the temperature difference between the third and fourth temperature generating junctions being a function of the low side current;

a high side Seebeck thermal difference sensor having first and second high side pluralities of thermal sensor junctions, the first plurality of temperature sensing junctions being thermally coupled to the first temperature generating junction of the high side thermal difference generator and the second plurality of temperature sensing junctions being thermally coupled to the second temperature generating junction of the high side thermal difference generator, the high side thermal difference generator providing a high side output voltage that is a function of the temperature difference between the first and second high side thermal difference generators;

a low side Seebeck thermal difference sensor having first and second pluralities of thermal sensor junctions, the first plurality of temperature sensing junctions being thermally coupled to the third temperature generating junction of the low side thermal difference generator and the fourth plurality of temperature sensing junctions being thermally coupled to the second temperature generating junction of the low side thermal difference generator, the low side thermal difference generator providing a low side output voltage that is a function of the temperature difference between the third and fourth low side thermal difference generators;

a control module coupled to the high side Seebeck temperature difference sensor and the low side Seebeck temperature difference sensor and receiving the high side output voltage and the low side output voltage, the control module operative to provide indicia as to the difference in magnitude and polarity between the high side output voltage and the low side output voltage, wherein the difference between the high side output voltage and the low side output voltage is indicative of the difference between the high side and low side currents, the control module being further operative, in the event that the magnitude of the difference between the high side and low side current exceeds a predetermined threshold, to disconnect the high side and/or low side current based on the polarity and magnitude of the of the difference between the high side output voltage and the low side output voltage.

18. The power line loss detector of claim 17 wherein the high side Peltier thermal difference generator includes:

a silicon substrate;

a first current transfer portion disposed on top of the silicon substrate, the first current transfer portion formed from a first conductive material;

an input conductor formed from a conductive material dissimilar to the first conductive material, the input conductor physically and electrically connected to the first current transfer portion and forming a first temperature generating junction at the junction between the input conductor and the first current transfer portion;

an output conductor formed from a conductive material dissimilar to the first conductive material, the output conductor physically and electrically connected to the first current transfer portion and being spaced apart from the first temperature generating junction, forming a second temperature generating junction at the junction between the output conductor and the first current transfer portion;

the high side thermal difference sensor including first and second pluralities of thermal sensor junctions, the first plurality of temperature sensing junctions being thermally coupled to the first temperature generating junction of the high side thermal difference generator and the second plurality of temperature sensing junctions being thermally coupled to the second temperature generating junction of the high side thermal difference generator, the high side thermal difference generator providing a high side output voltage that is a function of the temperature difference between the first and second high side temperature difference generators.

19. The power line loss detector of claim 17 wherein the low side Peltier thermal difference generator includes:

a silicon substrate;

a third current transfer portion disposed on top of the silicon substrate, the first current transfer portion formed from a first conductive material;

an input conductor formed from a conductive material dissimilar to the first conductive material;

the input conductor physically and electrically connected to the first current transfer portion forming a first temperature generating junction at the junction between the input conductor and the first current transfer portion;

an output conductor formed from a conductive material dissimilar to the first conductive material;

the output conductor physically and electrically connected to the first current transfer portion spaced apart from the first temperature generating junction, forming a second temperature generating junction at the junction between the output conductor and the first current transfer portion;

the high side thermal difference sensor including first and second pluralities of thermal sensor junctions, the first plurality of temperature sensing junctions being thermally coupled to the first temperature generating junction of the high side thermal difference generator and the second plurality of temperature sensing junctions being thermally coupled to the second temperature generating junction of the high side thermal difference generator, the high side thermal difference generator providing a high side output voltage that is a function of the temperature difference between the first and second high side temperature difference generators.

* * * * *